US010061646B2

(12) United States Patent
Feng et al.

(10) Patent No.: US 10,061,646 B2
(45) Date of Patent: Aug. 28, 2018

(54) WEAR LEVELING METHOD AND APPARATUS AND STORAGE MEDIUM

(71) Applicant: TENCENT TECHNOLOGY (SHENZHEN) COMPANY LIMITED, Shenzhen (CN)

(72) Inventors: Xugang Feng, Shenzhen (CN); Yinhu Wang, Shenzhen (CN); Jianping Zhu, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 101 days.

(21) Appl. No.: 15/137,145

(22) Filed: Apr. 25, 2016

(65) Prior Publication Data
US 2016/0239383 A1 Aug. 18, 2016

Related U.S. Application Data

(63) Continuation of application No. PCT/CN2014/088755, filed on Oct. 16, 2014.

(30) Foreign Application Priority Data

Oct. 23, 2013 (CN) .......................... 2013 1 0505230

(51) Int. Cl.
*G06F 11/10* (2006.01)
*G06F 12/02* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0619; G06F 3/064; G06F 3/0679; G06F 12/0246; G06F 2212/7209; G06F 2212/7211; G11C 29/52
(Continued)

(56) References Cited

U.S. PATENT DOCUMENTS 8,078,923 B2 * 12/2011 Nagadomi .......... G06F 11/1068
714/706
8,255,762 B2 * 8/2012 Nagadomi .......... G06F 11/1068
714/704
(Continued)

FOREIGN PATENT DOCUMENTS

CN 101354918 A 1/2009
CN 102073563 A 5/2011
(Continued)

OTHER PUBLICATIONS

The World Intellectual Property Organization (WIPO) International Search Report for PCT/CN2014/088755 dated Jan. 21, 2015.
(Continued)

Primary Examiner — John J Tabone, Jr.
(74) Attorney, Agent, or Firm — Anova Law Group, PLLC

(57) ABSTRACT

A wear leveling method and apparatus and a storage medium are disclosed, the method including: performing error correction on data read from a physical block to obtain corrected data, and counting corrected bits in the corrected data to obtain the number of the corrected bits, where the data as read may be previously written to the physical block in a dynamic wear leveling manner and/or a static wear leveling manner, and the number of the corrected bits is negatively correlated with a residual service life of the physical block; detecting whether the obtained number of the corrected bits is more than a preset bit-number threshold value; and transferring data stored in the physical block, if the number
(Continued)

of corrected bits is detected as more than the preset bit-number threshold value.

11 Claims, 4 Drawing Sheets

(51) Int. Cl.
    *G06F 3/06*     (2006.01)
    *G11C 29/52*     (2006.01)

(52) U.S. Cl.
    CPC ........ *G06F 3/0679* (2013.01); *G06F 12/0246* (2013.01); *G11C 29/52* (2013.01); *G06F 2212/7209* (2013.01); *G06F 2212/7211* (2013.01)

(58) Field of Classification Search
    USPC .................. 714/764, 718, 763, 773, 799
    See application file for complete search history.

(56) References Cited

U.S. PATENT DOCUMENTS

| | | | | |
|---|---|---|---|---|
| 9,594,673 | B2* | 3/2017 | Kim | .............. G06F 12/0246 |
| 2010/0107021 | A1* | 4/2010 | Nagadomi | .......... G06F 11/1068 |
| | | | | 714/704 |
| 2012/0060066 | A1* | 3/2012 | Nagadomi | .......... G06F 11/1068 |
| | | | | 714/704 |
| 2012/0300260 | A1* | 11/2012 | Takizawa | ............... G03G 15/50 |
| | | | | 358/1.16 |
| 2012/0303868 | A1 | 11/2012 | Tucek | |
| 2014/0075265 | A1* | 3/2014 | Hung | .................. G06F 11/1048 |
| | | | | 714/763 |
| 2015/0043282 | A1* | 2/2015 | Shin | ................... G11C 16/3495 |
| | | | | 365/185.21 |
| 2015/0052415 | A1* | 2/2015 | Um | ...................... G06F 11/1056 |
| | | | | 714/768 |
| 2015/0135025 | A1* | 5/2015 | Kim | ................... G06F 12/0246 |
| | | | | 714/704 |

FOREIGN PATENT DOCUMENTS

| | | |
|---|---|---|
| CN | 102508785 A | 6/2012 |
| CN | 102750191 A | 10/2012 |
| CN | 102789423 A | 11/2012 |
| CN | 102789813 A | 11/2012 |
| CN | 103049389 A | 4/2013 |
| CN | 103092770 A | 5/2013 |

OTHER PUBLICATIONS

The State Intellectual Property Office of the People's Republic of China (SIPO) Office Action 1 for 201310505230.9 dated Jan. 17, 2018 7 Pages (including translation).

* cited by examiner

WEAR LEVELING METHOD AND APPARATUS AND STORAGE MEDIUM

CROSS-REFERENCE TO RELATED APPLICATIONS

This application is a continuation of PCT Patent Application No. PCT/CN2014/088755, filed on Oct. 16, 2014, which claims priority to Chinese Patent Application No. 201310505230.9, entitled "WEAR LEVELING METHOD AND APPARATUS", filed on Oct. 23, 2013 by SHENZHEN TENCENT COMPUTER SYSTEM CO., LTD., the entire contents of all of which are incorporated herein by reference.

FIELD OF THE DISCLOSURE

The present disclosure relates to the field of computer technologies, in particular, to a wear leveling method and apparatus, and a storage medium.

BACKGROUND

A Solid State Disk (SSD) is formed by an array of solid state electronic storage chips. In the case where NAND flashes are adopted as storage media in the SSD, before data is written to a physical block of the SSD, the original data in the physical block needs to be erased. Considering the limited allowable erase count of the physical block, the physical block will become invalid if the limited allowable erase count of the physical block is reached, and data loss occurs if the data is written to the invalid physical block. Therefore, to ensure data security, wear leveling of physical blocks in the SSD is performed to make the erase counts of the physical blocks as even as possible, and to avoid the loss of data written to a certain physical block which has been erased for excessive times.

It is assumed that the allowable erase count of each physical block in the SSD is the same as that in any other physical block in the SSD in the prior art, thus the erase count of each physical block of the SSD may be made even with that in the other physical blocks of the SSD by writing data to a physical block which has been erased for a relatively small number of times. However, due to factors such as the limitation of SSD manufacturing technique and mixed use of old and new SSDs, not all of the physical blocks share the same allowable erase count, instead, a certain physical block which has been erased for a relatively small number of times and selected for storing data might have a relatively small allowable erase count, that is, the residual service life of the selected physical block may be shorter than that of a physical block which has been erased for more times, thus a data loss occurs when data is written to the selected physical block, thereby degrading data security.

For example, in the case where the allowable erase count of a free first physical block is 2000 and the allowable erase count of a free second physical block is 10000, if the first physical block has been erased for 1950 times and the second physical block has been erased for 2000 times, then data will be written to the first physical block that has been erased for less times instead of the second physical block which is provided with a larger allowable erase count, as a result, the current erase count of the first physical block is close to the allowable erase count of the first physical block, thereby degrading the security of data written to the first physical block.

The disclosed method and system are directed to solve one or more problems set forth above and other problems.

BRIEF SUMMARY OF THE DISCLOSURE

To avoid the case where a physical block erased for a small number of times that is selected for storing data might have a small allowable erase count and hence the security of the data stored in the physical block is degraded, an embodiment of the present disclosure provides a wear leveling method and apparatus and a storage medium as follows.

In an aspect, an embodiment of the present disclosure provides a wear leveling method, including: reading a data stored in a physical block; performing error correction on data read from a physical block to obtain corrected data, and counting corrected bits in the corrected data to obtain the number of the corrected bits. The data as read may be previously written to the physical block in a dynamic wear leveling manner and/or a static wear leveling manner, and the number of the corrected bits is negatively correlated with a residual service life of the physical block. The wear leveling method may further include detecting whether the obtained number of the corrected bits is more than a preset bit-number threshold value; and transferring data stored in the physical block, if the number of the corrected bits is detected as more than the preset bit-number threshold value.

In another aspect, an embodiment of the present disclosure provides wear leveling apparatus, including a first obtaining module, a first detecting module, and a transferring module. The first obtaining module may be configured to perform error correction on data read from a physical block to obtain corrected data and counting corrected bits in the corrected data to obtain the number of the corrected bits. The data as read may be previously written to the physical block in a dynamic wear leveling manner and/or a static wear leveling manner, and the number of the corrected bits is negatively correlated with a residual service life of the physical block. The first detecting module may be configured to detect whether the obtained number of the corrected bits is more than a preset bit-number threshold value. The transferring module may be configured to transfer data stored in the physical block, if the number of the corrected bits is detected as more than the preset bit-number threshold value.

In still another aspect, an embodiment of the present disclosure provides a storage medium containing computer-readable instructions, where the computer-readable instructions, when being executed by a computer processor, are configured to perform a wear leveling method comprising steps of: performing error correction on data read from a physical block to obtain corrected data, and counting corrected bits in the corrected data to obtain the number of the corrected bits, where the data as read may be previously written to the physical block in a dynamic wear leveling manner and/or a static wear leveling manner, and the number of the corrected bits is negatively correlated with the residual service life of the physical block; detecting whether the obtained number of the corrected bits is more than a preset bit-number threshold value; and transferring data stored in the physical block, if the number of corrected bits is detected as more than the preset bit-number threshold value.

In embodiments of the present invention, error correction is performed on data read from a physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block; it is detected whether the obtained number of the corrected bits is more than the preset bit-number threshold value; and if the number of the corrected bits is detected as more than the preset bit-number threshold value, the data stored in the physical block is transferred, so that the wear leveling of the physical blocks in the SSD is implemented. Considering the fact that a larger number of corrected bits of data means a shorter residual service life of the physical block containing the data, and that the data is previously written to the physical block in the dynamic wear leveling manner and/or the static wear leveling manner, the number of corrected bits may be employed to predict the residual service life of the physical block, and data stored in a physical block with a short residual service life is transferred to another physical block that has been erased for a relatively small number of times and has a longer residual service life. Thus, it can be avoided that a physical block having a small erase count but also a small allowable erase count is selected for storing data, and the security of data written to the physical block is improved.

BRIEF DESCRIPTION OF THE DRAWINGS

The accompanying drawings, which form a part of the present disclosure, are intended to provide further explanation of the present disclosure. Exemplary embodiments of the present invention and illustration thereof are intended to explain the disclosure but not to improperly limit the disclosure. The drawings may be modified and substituted by those skilled in the art without any creative work.

DETAILED DESCRIPTION

It should be noted that embodiments of the present invention and features therein can be combined with each other if no conflict arises. The present disclosure will be illustrated in detail with reference to the drawings and in conjunction with the embodiments in order to make solutions and advantages of the present disclosure more apparent. The described particular embodiments are provided merely for explaining the disclosure, but not limiting the disclosure.

Figure 1:
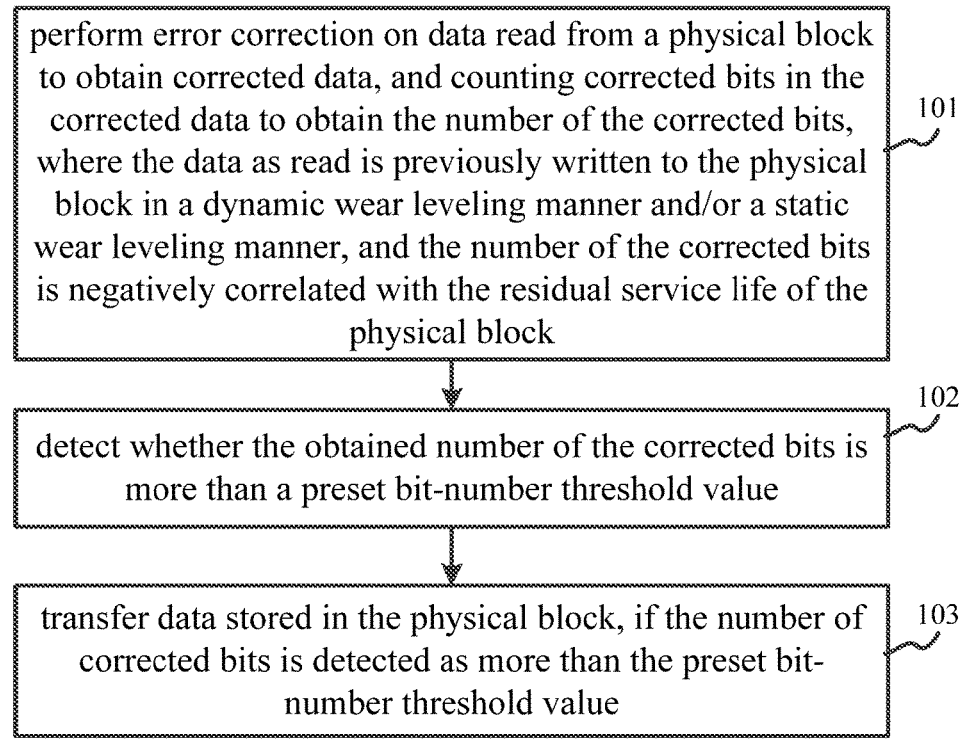
FIG. 1 is a flowchart of a wear leveling method according to an embodiment of the present invention.

Referring to FIG. 1 which shows a flowchart of a wear leveling method according to an embodiment of the present invention, and the wear leveling method, which may be applied to a Flash Translation Layer (FTL), includes the following Steps 101, 102 and 103. In some embodiments, a software program integrating functionalities of the FTL may facilitate communications in between a lower level driver layer and an upper level SSD logic layer, and carry out the disclosed wear leveling method. The lower level driver layer may be configured to facilitate interactions between the disclosed software program and the hardware components (e.g., firmware and NAND Flash). The upper level SSD logic layer may respond to data input/output instructions from application programs and request to write/read data directed by the FTL correspondingly. The software program may be configured to establish and maintain a mapping table between logical block addresses and physical block addresses, implement the disclosed wear leveling method, recycle trash data, etc. The software program may scan and collect information about all physical blocks. The physical blocks may include a free type which is ready to be used/written, a used/occupied type which contains data, an erroneous type, and a scrub type whose data needs to be transferred. The software program may, when being executed by one or more processing unit, implement the disclosed wear leveling method to maintain these four types of physical blocks based on specific rules. The information about the physical blocks may be organized in a form of Red-black tree.

At Step 101, error correction is performed on data read from a physical block to obtain corrected data, and corrected bits in the corrected data are counted to obtain the number of the corrected bits, where the data as read may be previously written to the physical block in a dynamic wear leveling manner and/or a static wear leveling manner, and the number of the corrected bits is negatively correlated with the residual service life of the physical block. For example, when data consisting of eight bits "00110101" stored in a physical block in an SSD is read out as "00110110", that is, last two bits of the data as read out are incorrect, error correction performed on the data as read out can correct these two incorrect bits to obtain corrected data "00110101", thus the number of corrected bits is obtained as 2.

The dynamic wear leveling manner, as used herein, may refer to writing data to a free physical block which has been erased for a relatively small number of times, so that this physical block can be erased for more times because the data written to the physical block might be updated soon. The static wear leveling manner, as used herein, may include determining whether a written data has a relatively long update period, and transferring the data to a free physical block which has been erased for a relatively large number of times, so that the original physical block where the data is stored may be used for storing other data. The original physical block might be updated soon so that it may be erased for more times. An erase count of a physical block, as used herein, may refer to a number of times that the physical block has been erased. The erase counts of all physical blocks may be maintained by the disclosed software program applied at the flash translation layer.

Because the data as read is written to physical blocks in the dynamic wear leveling manner and/or the static wear leveling manner in the embodiment, the erase counts of all physical blocks are made as even as possible, to avoid the occurrence of certain excessively erased physical blocks in an SSD which causes invalidation of the SSD still containing numerous physical blocks not yet erased for up to the respective allowable times, so that the residual service life of the SSD is prolonged. A physical block can be put through a limited number of erase cycles before becoming unreliable, and such number may be referred as an allowable erase count of the physical block.

Herein, according to the dynamic wear leveling manner, frequently modified data or any data having undetermined modification frequency is written to a free physical block that has been erased for a relatively small number of times (i.e., a free physical block having a relatively small erase count), and data that may not be modified for a long time is written to a free physical block that has been erased for a relatively large number of times (i.e., a free physical block having a relatively large erase count).

According to the static wear leveling manner, a physical block containing data updated in a long update period is determined among occupied physical blocks, and the data in the determined physical block is transferred to a free physical block that has been erased for a relatively large number of times, so that the determined physical block then becomes free and may be subsequently used for storing other data that is modified more frequently.

When reading the data written in the dynamic wear leveling manner and/or the static wear leveling manner, data read from a physical block that has been erased for almost the corresponding allowable number of times (i.e., a physical block whose current erase count is approaching its allowable erase count) might be incorrect and need to be corrected. Generally, when current erase count of the physical block is closer to its corresponding allowable erase count, more bits of the data may be read incorrectly and more bits may be corrected by an error correcting process performed on the data. Therefore, the number of the corrected bits may be obtained to reflect the residual service life of the physical block.

At Step 102, it is detected whether the number of the corrected bits is more than a preset bit-number threshold value, and if the number of the corrected bits is detected as more than the preset bit-number threshold value, Step 103 is performed.

The bit-number threshold value refers to the minimal number of corrected bits for transferring the data stored in the physical block, and may be preset and modified as desired, which is not limited herein.

The case where the number of the corrected bits is more than the bit-number threshold value means that the physical block has been erased for almost up to the allowable erase count and the residual service life of the physical block is short, thus the physical block need to be processed accordingly by proceeding with Step 103. On the contrary, the case where the number of the corrected bits is no more than the bit-number threshold value means that the physical block has been erased for far less than the allowable erase count and the residual service life of the physical block is long, thus the data stored in the physical block need not be transferred accordingly.

At Step 103, the data stored in the physical block is transferred. Because the physical block has been erased for almost up to the allowable erase count, the data stored in the physical block is transferred to another free physical block which has a long residual service life, to ensure data security.

In some embodiments, when receiving a data-reading instruction from an upper logic, the data may be read and transmitted to the upper logic first, and then be transferred to another physical block asynchronously if the number of the corrected bits is more than a preset bit-number threshold value. Specifically, after the data is read and transmitted to the upper logic, a logic block correspondingly mapped to this original physical block may be locked to prevent incoming read/write instructions from the upper logic. A new physical block may be found based on certain search criteria (e.g., a physical block having a smaller erase count). The data stored in the original physical block may be transferred to the new physical block. Upon confirming that the data is successfully written to the new physical block, the mapping destination of the locked logic block may be modified to the new physical block. Further, the data on the original physical block may be erased asynchronously. Afterwards, the logic block may be unlocked, and the data transfer may be completed.

As can be seen from the above, in the wear leveling method according to the present embodiment, error correction is performed on data read from a physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block; it is detected whether the obtained number of the corrected bits is more than the preset bit-number threshold value; and if the number of the corrected bits is detected as more than the preset bit-number threshold value, the data stored in the physical block is transferred, so that the wear leveling of the physical blocks is implemented. Considering the fact that a larger number of corrected bits of data means a shorter residual service life of the physical block containing the data, and that the data is previously written to the physical block in the dynamic wear leveling manner and/or the static wear leveling manner, the number of corrected bits may be employed to predict the residual service life of the physical block, and data stored in a physical block with a short residual service life is transferred to another physical block that has been erased for a relatively small number of times and has a longer residual service life, so that the case where a physical block erased for a small number of times that is selected for storing data might have a small allowable erase count is avoided, and the security of data written to the physical block is improved.

Figure 2:
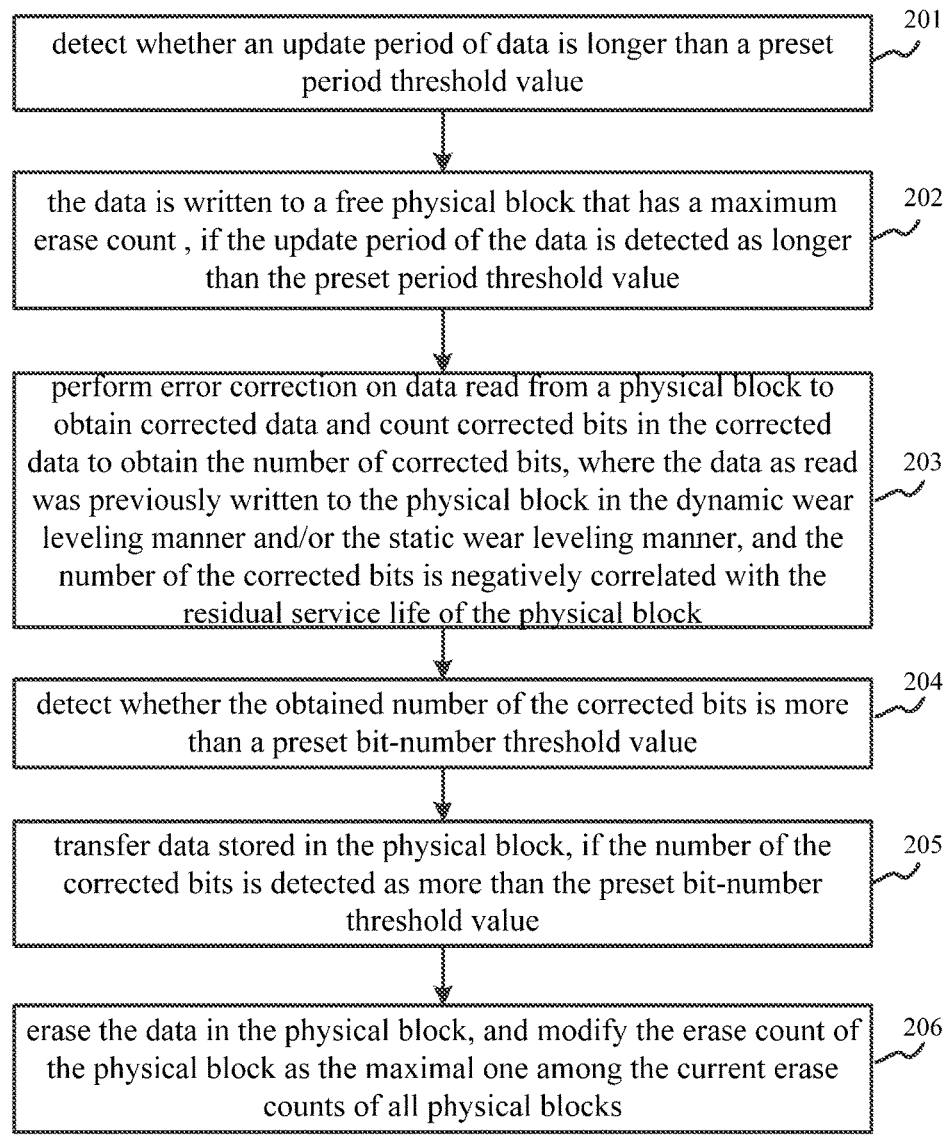
FIG. 2 is a flowchart of a wear leveling method according to another embodiment of the present invention.

FIG. 2 shows a flowchart of a wear leveling method according to another embodiment of the present invention, and the wear leveling method may be applied to an FTL. The present embodiment is different from the preceding embodiment in that a step of writing data to a physical block of an SSD in the dynamic wear leveling manner and/or the static wear leveling manner is added, and after the data in the physical block is transferred, the data is erased from the physical block and the erase count of the physical block is modified, so that the erase count of each physical block of the SSD may be made more even with that in the other physical blocks of the SSD, and the service life of the SSD is further prolonged. The wear leveling method includes the following Steps 201 to 206.

At Step 201, it is detected whether an update period of data is longer than a preset period threshold value, and if it is detected that the update period of the data is longer than the preset period threshold value, Step 202 is performed.

In the present embodiment, data may be written to the physical block in the dynamic wear leveling manner. In another embodiment, among data written to physical blocks, using the static wear leveling manner, data with a long update period written to a certain physical block may be transferred to a physical block that has larger erase counts. In yet another embodiment, the data may first be written to a physical block in the dynamic wear leveling manner, and then using the static wear leveling manner in written data, data with a long update period written to a certain physical block may be transferred to a physical block that has larger erase counts. The static wear leveling process may have various operation modes which are triggered in different occasions. For example, when an error occurs due to unbalanced wear leveling (e.g., a desired data is not found when restoring data from the recycle bin), the static wearing leveling process may be triggered in a front-end mode. In another example, when the system is idle, the static wearing leveling process may be triggered in a back-end mode. In yet another example, every time a free physical block is requested, a wearing counter may increase by one, and when the wearing counter reaches a certain threshold, the static wearing leveling process may be triggered in a periodic mode. In another example, when the difference between a maximum erase count and a minimum erase count is greater than a certain threshold, the static wearing leveling process may be triggered in a balancing mode.

Because the data is written to physical blocks in the dynamic wear leveling manner and/or the static wear leveling manner in the present embodiment, the erase count of each physical block is made as even as possible with that in the other physical blocks according to the erase counts of all the physical blocks, to avoid the occurrence of certain excessively erased physical blocks in the SSD which causes invalidation of the SSD still containing numerous physical blocks not yet erased for up to the respective allowable times, so that the residual service life of the SSD is prolonged.

If data with a long update period is written to a physical block of an SSD, the data may be stored in the physical block for a long time and hence the erase count of this physical block may not be increased within the update period, so that the invalidation of the physical block is delayed to prolong the residual service life of the SSD. As such, when writing data to a physical block in the dynamic wear leveling manner and/or the static wear leveling manner, the data may be written to the physical block based on both the erase count of the physical block and the update period of the data.

In particular, it is detected whether the update period of the data is longer than the preset period threshold value. If it is detected that the update period of the data is longer than the preset period threshold value, Step 202 is performed to write the data to the physical block, and if it is detected that the update period of the data is less than or equal to the preset period threshold value, a physical block that has been erased for a less number of times is selected for storing the data.

In the present embodiment, considering the variety of update periods of data, a statistics of the update periods of the data is made according to property information of the data. For example, if an update period of data from a certain device is relatively long, while an update period of data from another device is relatively short, the update period of data may be determined from the source of the data. Likewise, if an update period of data of a certain type is relatively long, while an update period of data of another type is relatively short, the update period of data may be determined from the type of the data.

The present embodiment is further described below by an example where the update period of data is determined from the type of the data. Particularly, a statistics of update periods of data to be written to physical blocks is made by types of the data, to determine at least one data type corresponding to a long update period, and generate a data type list according to the determined at least one data type. In an implementation, the data type list may be updated, so that the data type list is more adapted to use habits of a user, and the precision of the data type list may be improved. Here, the statistics of the update periods of the data made by types of the data may be implemented by: obtaining the type of data written to each physical block; making a statistics of update periods of data by each type of the data; and obtaining an average of the update periods of the data of each type as an update period of this type of data.

In an implementation of the present embodiment, detecting whether the update period of data is longer than the preset period threshold value may include: 1) obtaining the type of data; 2) detecting whether the type of the data is in a preset data type list; and 3) determining that the update period of the data is longer than the preset period threshold value if it is detected that the type of the data is in the preset data type list. In particular, before the data is written to a physical block, the type of the data is obtained and compared with data types in the preset data type list. If the type of the data is the same as one data type from the data type list, it is determined that the update period of the data is long, and Step 202 is performed; otherwise, if the type of the data is not present in the data type list, it is determined that the update period of the data is short, and a physical block erased for a small number of times is selected for storing the data.

At Step 202, the data is written to a free physical block that has been erased for the most times (i.e., a free physical block that has a maximum erase count).

Upon each operation on a physical block of an SSD, the maximal number of times of erasing (i.e., maximum erase count), the minimal number of times of erasing (i.e., minimum erase count), and an average number of times of erasing (i.e., average erase count) among all the physical blocks of the SSD are calculated and updated. Therefore, in the present step, the maximal number of times of erasing may be read out, a physical block that has been erased for a number of times that is the closest to the maximal number of times of erasing is searched out from free physical blocks, and the data is written to the physical block as searched out.

In the present embodiment, the erase counts of the free physical blocks may be stored in a Red-Black tree. Because data stored in the Red-Black tree is sorted according to the numeric value of the data, it is efficient to search for data having a certain value in the Red-Black tree, and hence the free physical block that has the maximum erase count may be searched out more efficiently, so that the efficiency in writing the data is improved.

At Step 203, when reading a data stored in a physical block, error correction is performed on data read from the physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block.

When reading the data written in the dynamic wear leveling manner and/or the static wear leveling manner, data read from a physical block approaching its allowable erase count might be incorrect and need to be corrected. Generally, more bits of the data as read out are incorrect and hence more bits are corrected by an error correcting process performed on the data, if the current erase count of the physical block is closer to the corresponding allowable erase count. Therefore, the number of the corrected bits may be obtained to reflect the residual service life of the physical block.

At Step 204, it is detected whether the obtained number of the corrected bits is more than a preset bit-number threshold value, and if the number of the corrected bits is detected as more than the preset bit-number threshold value, Step 205 is performed.

The bit-number threshold value refers to a minimal number of corrected bits to initiate transferring the data stored in the physical block. The bit-number threshold value is generally positively correlated with the correction capability of an Error Correcting Code (ECC), which is represented by the maximal number of bits correctable by the ECC. For example, if the maximal number of bits correctable by the ECC is 30 bits per kilobyte, the bit-number threshold value may be preset to 20 or 25, and if the maximal number of bits correctable by the ECC is 10 bits per kilobyte, the bit-number threshold value may be preset to 6 or 8. The preset threshold value is not limited in the present embodiment. Herein, the maximal number of bits correctable by the ECC may be obtained from a controller of the SSD.

The case where the number of the corrected bits is more than the bit-number threshold value means that the physical block has been erased for almost up to the allowable erase count and the residual service life of the physical block is short, thus the physical block need to be processed accordingly by proceeding with Step 205. On the contrary, the case where the number of the corrected bits is no more than the bit-number threshold value means that the physical block has been erased for far less than the allowable erase count and the residual service life of the physical block is long, thus the data stored in the physical block need not be transferred accordingly.

At Step 205, the data stored in the physical block is transferred. Because the physical block has been erased for almost up to the allowable erase count, the data stored in the physical block is transferred to another free physical block which has a long residual service life, to ensure data security.

At Step 206, the data stored in the physical block is erased, and the erase count of the physical block is modified as the maximal one among the current erase counts of all physical blocks of the SSD.

If the current erase count of the physical block is small, the increment range of the erase count of the physical block may be increased to prevent the physical block from being selected again according to erase counts. For example, the erase count of the physical block may be increased by a preset value larger than 1, or the erase count of the physical block may be set as a preset value far larger than the current erase count of the physical block. The present embodiment is further described below by an example where the erase count of the physical block is set as a preset value.

In particular, the current maximal erase count of the SSD is read out, and the erase count of the physical block is modified as the current maximal erase count of the SSD. In this case, the data is not written to this physical block so that the invalidation of this physical block is delayed and the residual service life of the SSD is prolonged, considering that the erase count of this physical block is the maximal and data can be written to another physical block having a relatively small erase count according to the dynamic wear leveling manner and/or the static wear leveling manner.

Furthermore, in some embodiments, before modifying the erase count of the physical block, it is detected whether the erase count of the physical block is small. If the erase count of the physical block is small, the increment extent of the erase count of the physical block is increased; and if the erase count of the physical block is large, future data may not likely be written to this physical block according to the dynamic wear leveling manner and/or the static wear leveling manner, and the erase count of the physical block is increased by only 1.

In particular, before modifying the erase count of the physical block as the maximal one among the current erase counts of all physical blocks of the SSD, the method further includes: 1) obtaining the recorded erase count of the physical block, 2) detecting whether the recorded erase count of the physical block is less than an average erase count of all physical blocks in the SSD, and 3) if it is detected that the recorded erase count of the physical block is less than the average erase count of all the physical blocks, triggering the step of modifying the erase count of the physical block as the maximal one among the current erase counts of all physical blocks of the SSD.

In the present embodiment, if the erase count of the physical block is more than the average erase count of all the physical blocks, the erase count of the physical block is determined to be relatively large; and if the erase count of the physical block is no more than the average erase count of all the physical blocks, the erase count of the physical block is determined to be relatively small. Here, the average erase count of all the physical blocks may be obtained directly. Of course, it is possible to determine whether the erase count of the physical block is small or large in any other way, which is not limited in the present embodiment.

As can be seen from the above, in the wear leveling method according to the present embodiment, error correction is performed on data read from a physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block; it is detected whether the obtained number of the corrected bits is more than the preset bit-number threshold value; and if the number of the corrected bits is determined as more than the preset bit-number threshold value, the data stored in the physical block is transferred, so that the wear leveling of the physical blocks is implemented. Considering the fact that a larger number of corrected bits of data means a shorter residual service life of the physical block containing the data, and that the data is previously written to the physical block in the dynamic wear leveling manner and/or the static wear leveling manner, the number of corrected bits may be employed to predict the residual service life of the physical block, and data stored in a physical block with a short residual service life is transferred to another physical block that has a relatively erase count and has a longer residual service life. In this way, the case where a physical block erased for a small number of times that is selected for storing data might have a small allowable erase count is avoided, and the security of data written to the physical block is improved. In addition, the erase count of the physical block is modified as the maximal one among the current erase counts of all physical blocks of the SSD instead of being increased by 1, so that future data may not be written to this physical block according to the dynamic wear leveling manner and/or the static wear leveling manner, thereby preventing the increase of the erase count of this physical block and further prolonging the residual service life of the SSD.

Figure 3:
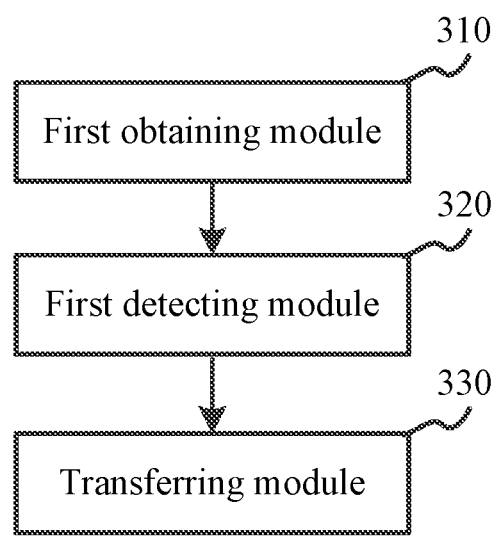
FIG. 3 is a structural block diagram showing a wear leveling apparatus according to an embodiment of the present invention.

FIG. 3 is a structural block diagram showing a wear leveling apparatus according to an embodiment of the present invention. The wear leveling apparatus may be applied to an FTL. The wear leveling apparatus may include a plurality of program modules that, when being executed by one or more processors, scan and collect information about all physical blocks, maintain a mapping table between logical block addresses and physical block addresses, and implement a wear leveling method. The wear leveling apparatus may include: a first obtaining module 310, which is configured to perform error correction on data read from a physical block to obtain corrected data, and count corrected bits in the corrected data to obtain the number of the corrected bits, where the data as read may be previously written to the physical block in a dynamic wear leveling manner and/or a static wear leveling manner, and the number of the corrected bits is negatively correlated with the residual service life of the physical block; a first detecting module 320, which is configured to detect whether the obtained number of the corrected bits is more than a preset bit-number threshold value; and a transferring module 330, which is configured to transfer the data stored in the physical block, if the first detecting module 320 detects that the number of the corrected bits is more than the preset bit-number threshold value.

As can be seen from the above, in the wear leveling method according to the present embodiment, error correction is performed on data read from a physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block; it is determined whether the obtained number of the corrected bits is more than the preset bit-number threshold value; and if the number of the corrected bits is determined as more than the preset bit-number threshold value, the data stored in the physical block is transferred, so that the wear leveling of the physical blocks is implemented. Considering the fact that a larger number of corrected bits of data means a shorter residual service life of the physical block containing the data, and that the data is previously written to the physical block in the dynamic wear leveling manner and/or the static wear leveling manner, the number of corrected bits may be employed to predict the residual service life of the physical block, and data stored in a physical block with a short residual service life is transferred to another physical block that has been erased for a relatively small number of times and has a longer residual service life, so that the case where a physical block erased for a small number of times that is selected for storing data might have a small allowable erase count is avoided, and the security of data written to the physical block is improved.

Figure 4:
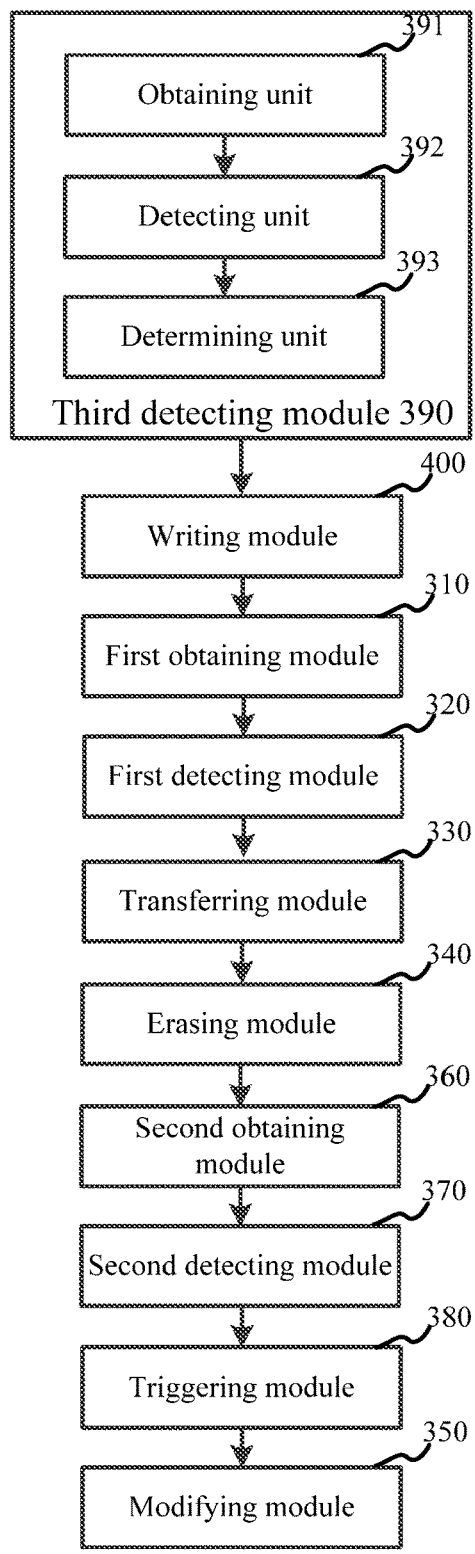
FIG. 4 is a structural block diagram showing a wear leveling apparatus according to another embodiment of the present invention.

FIG. 4 is a structural block diagram showing a wear leveling apparatus according to another embodiment of the present invention. The present embodiment is different from the preceding embodiment in that additional modules are included, and these additional modules are configured to write data to a physical block of an SSD in the dynamic wear leveling manner and/or the static wear leveling manner, and after the data in the physical block is transferred, erase the data stored in the physical block and modify the erase count of the physical block, so that the erase count of each physical block of the SSD may be made more even with that in the other physical blocks of the SSD, and the service life of the SSD is further prolonged. The wear leveling apparatus includes the first obtaining module 310, the first detecting module 320 and the transferring module 330.

The first obtaining module 310 is configured to perform error correction on data read from a physical block to obtain corrected data, and count corrected bits in the corrected data to obtain the number of the corrected bits, where the data as read may be previously written to the physical block in a dynamic wear leveling manner and/or a static wear leveling manner, and the number of the corrected bits is negatively correlated with the residual service life of the physical block.

The first detecting module 320 is configured to detect whether the obtained number of the corrected bits is more than a preset bit-number threshold value.

The transferring module 330 is configured to transfer the data stored in the physical block, if the first detecting module 320 detects that the number of the corrected bits is more than the preset bit-number threshold value.

The wear leveling apparatus further includes: an erasing module 340, which is configured to erase the data stored in the physical block after the data is transferred from the physical block by the transferring module 330; and a modifying module 350, which is configured to, after the data stored in the physical block is erased by the erasing module 340, modify the erase count of the physical block as the maximal one among the current erase counts of all physical blocks of the SSD.

Further, the wear leveling apparatus may further include: a second obtaining module 360, which is configured to obtain the recorded erase count of the physical block before the modifying module 350 modifies the erase count of the physical block as the maximal one among the current erase counts of all physical blocks of the SSD; a second detecting module 370, which is configured to detect whether the recorded erase count of the physical block that is obtained by the second obtaining module 360 is less than the average erase count of all physical blocks in the SSD; and a triggering module 380, which is configured to, if the second detecting module 370 detects that the obtained recorded erase count of the physical block is less than the average erase count of all the physical blocks, trigger the modifying module 350 to modify the erase count of the physical block as the maximal one among the current erase counts of all physical blocks of the SSD.

Further, the wear leveling apparatus includes: a third detecting module 390, which is configured to detect whether the update period of the data is longer than the preset period threshold value before the first obtaining module 310 performs the error correction on the data read from the physical block to obtain corrected data and counts corrected bits in the corrected data to obtain the number of the corrected bits; and a writing module 400, which is configured to write the data to a free physical block that has been erased for the most times if the third detecting module 390 detects that the update period of the data is longer than the preset period threshold value.

Particularly, the third detecting module 390 includes: an obtaining unit 391, which is configured to obtain the type of data; a detecting unit 392, which is configured to detect whether the type of the data that is obtained by the obtaining unit 391 is one from a preset data type list; and a determining unit 393, which is configured to determine that the update period of the data is longer than the preset period threshold value if the detecting unit 392 detects that the type of the data is one from the preset data type list.

As can be seen from the above, in the wear leveling method according to the present embodiment, error correction is performed on data read from a physical block to obtain corrected data, and corrected bits in the corrected data are counted to obtain the number of the corrected bits, where the data as read may be previously written to the physical block in the dynamic wear leveling manner and/or the static wear leveling manner, and the number of the corrected bits is negatively correlated with the residual service life of the physical block; it is determined whether the obtained number of the corrected bits is more than the preset bit-number threshold value; and if the number of the corrected bits is determined as more than the preset bit-number threshold value, the data stored in the physical block is transferred, so that the wear leveling of the physical blocks is implemented. Considering the fact that a larger number of corrected bits of data means a shorter residual service life of the physical block containing the data, and that the data is previously written to the physical block in the dynamic wear leveling manner and/or the static wear leveling manner, the number of corrected bits may be employed to predict the residual service life of the physical block, and data stored in a physical block with a short residual service life is transferred to another physical block that has been erased for a relatively small number of times and has a longer residual service life, so that the case where a physical block erased for a small number of times that is selected for storing data might have a small allowable erase count is avoided, and the security of data written to the physical block is improved. In addition, the erase count of the physical block is modified as the current maximal number of times of erasing among all physical blocks in the SSD instead of being increased by 1, so that future data may not be written to this physical block according to the dynamic wear leveling manner and/or the static wear leveling manner, thereby preventing the increase of the erase count of this physical block and further prolonging the residual service life of the SSD.

It is noted that the wear leveling apparatus provided in the above embodiment implements the wear leveling by its various functional modules as described in the above example. However, the functions of the various modules may be alternatively achieved by different functional modules in practice, that is, the internal structure of the wear leveling apparatus may be divided into different functional modules to achieve all or a part of the above functions. In addition, the wear leveling apparatus shares the same concept with the wear leveling method provided as above, and reference may be made to the description of the wear leveling method for details of the implementation of the wear leveling apparatus, which will not be described again in detail herein.

It is appreciated by those skilled in the art that all or a part of the above steps in the embodiments may be accomplished by hardware, or accomplished by hardware instructed by a software program. The software program may be stored in a computer-readable storage medium, which may be a Read Only Memory, a disk or a Compact Disk, for example.

Additionally, an embodiment of the present invention provides a storage medium containing computer-readable instructions, where the computer-readable instructions, when being executed by a computer processor, are configured to perform a wear leveling method including steps of: performing error correction on data read from a physical block to obtain corrected data, and counting corrected bits in the corrected data to obtain the number of the corrected bits, where the data as read may be previously written to the physical block in a dynamic wear leveling manner and/or a static wear leveling manner, and the number of the corrected bits is negatively correlated with the residual service life of the physical block; detecting whether the obtained number of the corrected bits is more than a preset bit-number threshold value; and transferring the data stored in the physical block, if the number of the corrected bits is detected as more than the preset bit-number threshold value.

The wear leveling method performed by the computer-readable instructions being executed by the computer processor is not limited to the above steps. That is, the computer-readable instructions being executed by the computer processor may be configured to perform any other step of the wear leveling method provided in any embodiment of the invention.

In various embodiments, the disclosed modules for the exemplary system as depicted above can be configured in one device or configured in multiple devices as desired. The modules disclosed herein can be integrated in one module or in multiple modules for processing messages. Each of the modules disclosed herein can be divided into one or more sub-modules, which can be recombined in any manners.

In addition, each functional module/unit in various disclosed embodiments can be integrated in a processing unit, or each module/unit can exist separately and physically, or two or more modules/units can be integrated in one unit. The integrated units as disclosed above can be implemented in the form of hardware and/or in the form of software functional unit(s).

When the integrated modules/units as disclosed above are implemented in the form of software functional unit(s) and sold or used as an independent product, the integrated units can be stored in a computer readable storage medium. Therefore, the whole or part of the essential technical scheme of the present disclosure can be reflected in the form of software product(s). The computer software product(s) can be stored in a storage medium, which can include a plurality of instructions to enable a computing device (e.g., a mobile terminal, a personal computer, a server, a network device, etc.) to execute all or part of the steps as disclosed in accordance with various embodiments of the present disclosure. The storage medium can include various media for storing programming codes including, for example, U-disk, portable hard disk, ROM, RAM, magnetic disk, optical disk, etc.

The exemplary embodiments of the present invention have been described as above, but are not intended to limit the invention. Modifications, substitutions and improvements to the present invention may readily occur to those skilled in the art in light of the principle of the embodiments of the present invention without departing from the scope of the invention, and all these modifications, substitutions and improvements fall within the scope of the invention.

What is claimed is:

1. A wear leveling method, comprising:
   reading a data stored in a physical block of a non-transitory computer readable medium;
   performing error correction on the data read from the physical block to obtain a corrected data, and counting corrected bits in the corrected data to obtain a number of the corrected bits, wherein the data is previously written to the physical block in a dynamic wear leveling manner or a static wear leveling manner, and the number of the corrected bits is negatively correlated with a residual service life of the physical block;
   detecting whether the obtained number of the corrected bits is more than a preset bit-number threshold value; and
   transferring the data stored in the physical block to a free physical block of the non-transitory computer readable medium, if the number of the corrected bits is detected as more than the preset bit-number threshold value.

2. The wear leveling method of claim 1, wherein after transferring the data stored in the physical block, the method further comprises:
   erasing the data stored in the physical block; and
   modifying an erase count of the physical block to be a maximal number among current erase counts of all physical blocks.

3. The wear leveling method of claim 2, wherein before modifying the erase count of the physical block to be the maximal number among the current erase counts of all the physical blocks, the method further comprises:
obtaining a recorded erase count of the physical block,
detecting whether the recorded erase count of the physical block is less than an average erase count of all the physical blocks, and
if it is detected that the recorded erase count of the physical block is less than the average erase count of all the physical blocks, triggering modifying of the erase count of the physical block to be the maximal number among the current erase counts of all the physical blocks.

4. The wear leveling method of claim 1, wherein before reading the data stored in the physical block, the method further comprises:
detecting whether an update period of the data is longer than a preset period threshold value; and
if the update period of the data is detected as longer than the preset period threshold value, writing the data to the physical block, the physical block being a free physical block that has a maximum erase count.

5. The wear leveling method of claim 4, wherein the detecting whether the update period of the data is longer than the preset period threshold value comprises:
obtaining a type of the data;
detecting whether the type of the data is in a preset data type list; and
determining that the update period of the data is longer than the preset period threshold value if the type of the data is in the preset data type list.

6. A wear leveling apparatus, comprising:
a processor;
a non-transitory computer readable medium coupled to the processor; and
a plurality of program modules stored in the non-transitory computer readable medium to be executed by the processor, the plurality of program modules comprising:
a first obtaining module configured to perform error correction on a data read from a physical block to obtain a corrected data, and count corrected bits in the corrected data to obtain a number of the corrected bits, wherein the data is previously written to the physical block in a dynamic wear leveling manner or a static wear leveling manner, and the number of the corrected bits is negatively correlated with a residual service life of the physical block;
a first detecting module configured to detect whether the obtained number of corrected bits is more than a preset bit-number threshold value; and
a transferring module configured to transfer the data stored in the physical block to a free physical block, if the number of corrected bits is detected as more than the preset bit-number threshold value.

7. The wear leveling apparatus of claim 6, further comprising:
an erasing module configured to erase the data stored in the physical block after the data is transferred from the physical block by the transferring module; and
a modifying module configured to, after the data in the physical block is erased by the erasing module, modify an erase count of the physical block to be a maximal number among current erase counts of all physical blocks.

8. The wear leveling apparatus of claim 7, further comprising:
a second obtaining module configured to obtain a recorded erase count of the physical block before the modifying module modifies the erase count of the physical block to be the maximal number among the current erase counts of all the physical blocks;
a second detecting module configured to detect whether the recorded erase count of the physical block that is obtained by the second obtaining module is greater than an average erase count of all the physical blocks; and
a triggering module configured to, if the second detecting module detects that the obtained recorded erase count of the physical block is less than the average erase count of all the physical blocks, trigger the modifying module to modify the erase count of the physical block to be the maximal number among the current erase counts of all the physical blocks.

9. The wear leveling apparatus of claim 6, further comprising:
a third detecting module configured to detect whether an update period of the data is longer than a preset period threshold value before the first obtaining module performs the error correction on the data read from the physical block to obtain the corrected data and counts the corrected bits in the corrected data to obtain the number of the corrected bits; and
a writing module configured to write the data to a free physical block that has a maximum erase count if the third detecting module detects that the update period of the data is longer than the preset period threshold value.

10. The wear leveling apparatus of claim 9, further comprising:
an obtaining unit configured to obtain a type of the data;
a detecting unit configured to detect whether the type of the data that is obtained by the obtaining unit is in a preset data type list; and
a determining unit configured to determine that the update period of the data is longer than the preset period threshold value if the detecting unit detects that the type of the data is in the preset data type list.

11. A non-transitory computer readable medium containing computer-readable instructions, wherein the computer-readable instructions, when being executed by a computer processor, are configured to perform a wear leveling method comprising steps of:
performing error correction on a data read from a physical block to obtain a corrected data, and counting corrected bits in the corrected data to obtain a number of the corrected bits, wherein the data is previously written to the physical block in a dynamic wear leveling manner or a static wear leveling manner, and the number of the corrected bits is negatively correlated with the residual service life of the physical block;
detecting whether the obtained number of corrected bits is more than a preset bit-number threshold value; and
transferring the data stored in the physical block to a free physical block, if the number of corrected bits is detected as more than the preset bit-number threshold value.

* * * * *